United States Patent [19]

Massa

[11] Patent Number: 4,859,897

[45] Date of Patent: Aug. 22, 1989

[54] DIRECTIONAL WATERPROOF ULTRASONIC TRANSDUCER FOR OPERATING IN AIR

[75] Inventor: Frank Massa, 280 Lincoln St., Hingham, Mass. 02043-1796

[73] Assignees: Frank Massa; Donald P. Massa; Gitta M. Kurlat, all of Cohasset, Mass.

[21] Appl. No.: 178,692

[22] Filed: Apr. 7, 1988

[51] Int. Cl.[4] .............................................. H01L 41/08

[52] U.S. Cl. .................................... 310/334; 310/326; 310/340; 310/369

[58] Field of Search ................ 310/322, 323, 334–337, 310/340, 369, 326, 327

[56] References Cited

U.S. PATENT DOCUMENTS

| | | | |
|---|---|---|---|
| 2,447,333 | 8/1948 | Hayes | 310/335 X |
| 2,480,535 | 8/1949 | Alois et al. | 310/337 X |
| 2,775,434 | 12/1956 | Probst | 310/337 X |
| 2,922,140 | 1/1960 | Levine et al. | 310/335 X |
| 3,748,637 | 7/1973 | Larson et al. | 310/335 X |
| 3,847,667 | 11/1974 | Massa | 310/369 X |
| 4,528,853 | 7/1985 | Lerch et al. | 310/335 X |
| 4,630,245 | 12/1986 | Dam | 310/334 X |

*Primary Examiner*—Mark O. Budd

[57] ABSTRACT

An improved ultrasonic transducer designed for rugged outdoor applications uses a thin-walled cylindrical tube of polarized ceramic operating in the fundamental circumferential resonant frequency mode. The major portion of the external surface area of the vibrating cylinder is covered by a sound insulating barrier, thereby preventing sound radiation from the covered non-radiating surface area portion of the cylinder. Specific unique relationships between the diameter, length and wall thickness of the ceramic tube, which are necessary to achieve the objects of the invention, are described.

8 Claims, 1 Drawing Sheet

DIRECTIONAL WATERPROOF ULTRASONIC TRANSDUCER FOR OPERATING IN AIR

This invention relates to the design of a rugged waterproof ultrasonic transducer for operating in the frequency region above 15 kHz which can be used in ultrasonic sensing systems to measure the distance to a nearby object such as, for example, the closeness of a wall surface of a loading dock against which the rear end of a trailer truck is approaching as the driver is backing up the vehicle without having a clear view of the actual position of the vehicle as it approaches the dock.

Previous designs of commercially successful ultrasonic transducers, such as described in FIGS. 1 and 2 of U.S. Pat. Nos. 2,967,957 and 3,128,532; and in FIGS. 1 and 3 of U.S. Pat. Nos. 3,578,995 and 3,638,052 employ a sealed lightweight thin metallic disc clamped at its periphery to act as a vibrating diaphragm. The peripherally clamped diaphragm is driven in the flexural resonance mode by a thin piezoelectric ceramic disc cemented to the center of the inner unexposed surface of the lightweight diaphragm. Such prior art transducers have found successful widespread commercial uses in protected environments such as indoors or in protective enclosures to prevent exposure of the diaphragm to harsh outdoor environments such as occur during rain or snow storms or when mud or slush is splashed over the exposed vibratile surface of the transducer.

To overcome some of the limitations of prior art ultrasonic transducers when exposed to harsh environmental conditions, attempts have been made to use high frequency microwave radar technology in proximity indicating systems. This alternative technology is much more expensive than the use of ultrasonics and, additionally, it is very much more difficult to measure proximity distances of a few inches using radio signals traveling over $10^{10}$ inches/sec. as compared to using sound traveling through air at less than $1.4\times10^4$ inches/sec.

The primary object of this invention is to overcome the difficulties introduced by the above described limitations of prior art ultrasonic transducers when used in proximity sensing systems for measuring distances to an object or wall ranging from several yards down to the order of a few inches during harsh outdoor weather conditions.

Another object of this invention is to use a tubular thin-walled piezoelectric cylinder in the manner to be described to operate in the fundamental circumferential resonant frequency mode and also to have the major portion of the external surface area of the vibrating cylinder covered by a sound insulating barrier, thereby to prevent sound radiation from the covered surface area portion of the cylinder.

Still another object of this invention is to control the diameter-to-length ratio of the piezoelectric cylindrical tube so that the fundamental circumferential resonance frequency of the cylindrical element remains below the fundamental length resonance frequency of the transducer element and thereby prevents interaction between the two separate resonance frequency modes during operation of the inventive transducer in ultrasonic proximity detection systems.

An additional object of this invention is to control the ratio of the wall thickness to the diameter of the cylindrical transducer element to achieve efficient operation of the ultrasonic transducer and also to realize a relatively low Q at the fundamental circumferential resonant frequency of the element.

The novel features which are characteristic of the invention are set forth with particularity in the appended claims. However, the invention itself, together with further objects and advantages thereof, will best be understood by reference to the following description of a preferred embodiment when taken in conjunction with the accompanying drawings in which:

Figure 4:
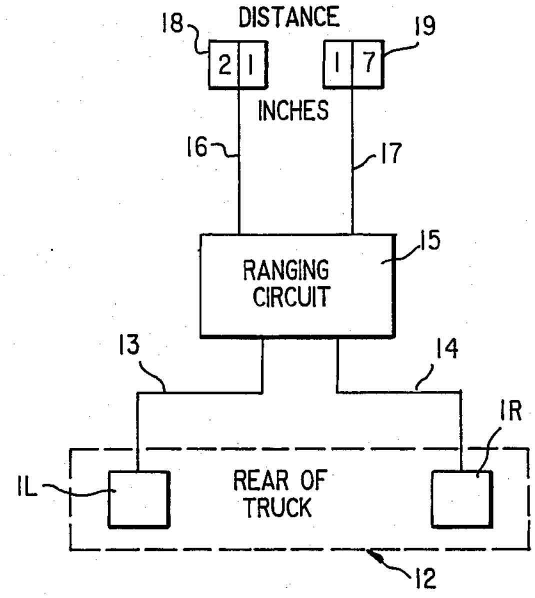

FIG. 4 is a schematic diagram illustrating one of the many uses that can be made of the inventive transducer to automatically sense the closing distances between the left and right-hand rear surfaces of a trailer truck while it is approaching the wall surface of a loading dock as the driver is backing up the vehicle, without having a clear view of the actual position of the vehicle's rear surface as it approaches the dock.

Figure 1:
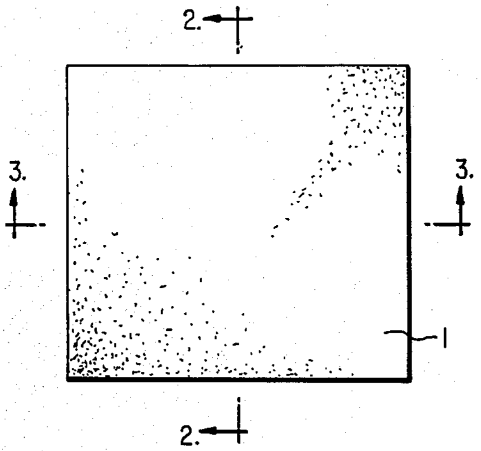
FIG. 1 is a plan view showing the front sound radiating surface of the inventive transducer.
Figure 2:
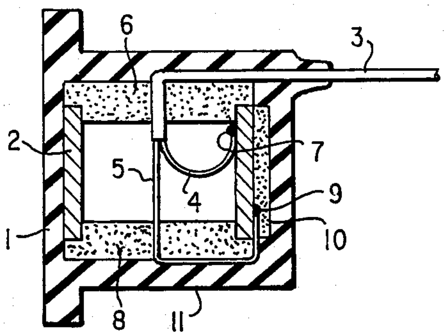
FIG. 2 is a cross-sectional view taken along the line 2—2 of FIG. 1.
Figure 3:
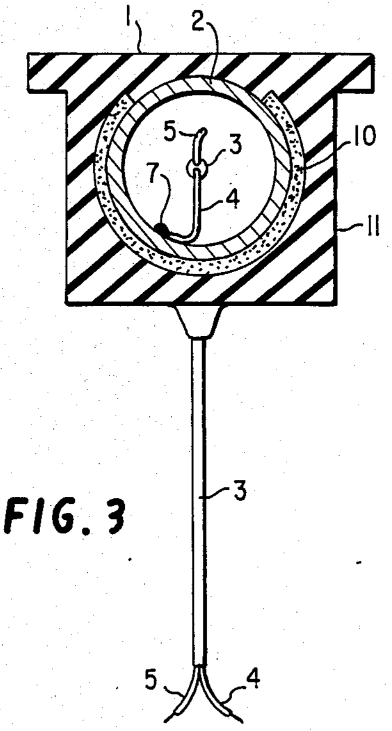
FIG. 3 is a cross-sectional view taken along the line 3—3 of FIG. 1.

Referring more particularly to the drawings, FIG. 1 illustrates the front plan view of the sound radiating surface 1 of the transducer. The construction of the transducer is shown in greater detail in the cross-sectional views illustrated in FIGS. 2 and 3. A cylindrical tube of polarized ceramic 2 such as lead-zirconate-titanate is provided with metallic electrodes applied to the inner and outer cylindrical wall surfaces either by the electroless nickel plating process or by the fired silver film process, as is well known in the art. In order to obtain maximum detection range during the operation of an ultrasonic proximity sensing system for which the inventive transducer has been designed to improve, it is necessary to minimize the attenuation loss for the transmission range over which the system is required to operate. In general, the attenuation loss is reduced as the frequency of the sound signal is reduced. However, by lowering the frequency, the size of the transducer also increases and the general background noise level in the outdoor environment in which the system must operate also increases, which in turn increases the background threshold noise level at the receiver which makes it more difficult to detect the low level echoes that are returned from the target at increased ranges.

The inventive design of the transducer disclosed in this Application is a compromise solution to the conflicting limitations that are imposed by varying the choice of operating frequency. To present a better understanding of applicant's analytical process by which he arrived at the optimum transducer design to take maximum advantage of the conflicting limitations which are imposed on an arbitrary choice of operating frequency, a short discussion of the technical considerations involved in arriving at the optimum design for the inventive transducer will follow.

From a considerable amount of experimental sound transmission loss data accumulated by Applicant over many years, an approximate empirical relationship has been derived between attenuation loss and frequency which can be represented by the equation $$\text{Attenuation} = 0.033f \text{ dB/meter} \qquad (1)$$

where: f=frequency in kilohertz.

From Eq. (1), the attenuation loss during the transmission of sound over the frequency range 20 kHz to 40 kHz will be approximately 0.66 dB/meter to 1.3 dB/meter. When measuring the distance to a target with an ultrasonic ranging system, the attenuation defined by Eq. (1) will be doubled due to the added attenuation that takes place during the return trip of the reflected ultrasonic echo from the object or wall being detected. Thus, the total attenuation loss per meter distance separation to a reflecting target will be between 1.3 dB and 2.6 dB for a transducer operating within the frequency range 20 kHz and 40 kHz. If the operating frequency is significantly greater than 40 kHz, the attenuation will rapidly become greater than 2.6 dB per meter of separation distance between the transducer and the target. For example, if the frequency is increased to 80 kHz, it can be seen from equation (1) that the attenuation will become 52 dB for a target range of 10 meters. This amount of attenuation loss would cause an unacceptable degradation to the operation of the proximity detector if the system would use a transducer designed for operating at 80 kHz.

If the operating frequency is lowered to 10 kHz, the attenuation loss is only about $\frac{1}{2}$dB per meter less than the loss at 20 kHz which is a relatively insignificant amount of improvement for the proximity detection system. However the lowering of the operating frequency to 10 kHz would double the linear dimensions of the transducer, making it approximately eight times the volume and correspondingly increase its weight and cost. Thus, the optimum operating frequency for the inventive transducer is established to be within the approximate frequency range 20 kHz to 40 kHz. Outside this uniquely chosen limited frequency range of 20 kHz to 40 kHz, whether it is significantly lower or significantly higher in frequency, would be an undesireable choice as shown by the above analysis.

Having determined the optimum choice of operating frequency for the inventive transducer, it follows that the optimum choice of diameter of the polarized ceramic tubular element to resonate in the circumferential resonant mode within the frequency range 20 kHz to 40 kHz will be between one and two inches. The length dimension of the cylindrical transducer element should not exceed $1\frac{1}{2}$ times the diameter of the cylinder in order that the length resonance frequency mode remains higher than the circumferential resonance frequency mode and thereby will avoid any possibility of the length resonance interfering with the desired primary circumferential resonant frequency mode of the transducer.

Referring back to FIGS. 2 and 3 which show cross-sectional views of the transducer assembly, a polarized ceramic cylinder 2 includes electrodes on the inside and outside surfaces of the ceramic wall which are applied in the conventional manner as is well known in the art and is not a part of this invention. The cylindrical ceramic shell is polarized by applying a dc voltage across the electrode surfaces of approximately 50,000 volts/inch of wall thickness to make the ceramic piezoelectric as is also well known in the art. A two-conductor cable 3 is inserted through a clearance hole in the center of the end cap 6 which is made of sound insulating material such as foam rubber or foam vinyl. The wire 4 is soldered to the inside electrode surface at the point 7 an the conductor 5 passes through a clearance hole in the center of end cap 8, which is made of the same material as the end cap 6, and is then soldered to the outside electrode surface of the ceramic at point 9 as illustrated. A large portion of the outer peripheral surface area of the cylindrical ceramic element 2 is covered with a layer of sound insulating material 10, which is held in place by any suitable cement. The sound insulating material prevents sound radiation from the covered surface portion of the ceramic cylinder. The ceramic element assembly is then totally encapsulated within a potting compound such as polyurethane 11 to become a complete rugged waterproof transducer which achieves the objects of this invention.

In addition to the above disclosed one-inch to two-inch optimum diameter range required for the cylindrical ceramic element and to the additional specific maximum length requirement of the cylinder that should not exceed $1\frac{1}{2}$ times the diameter, Applicant has found it necessary to keep the wall thickness of the ceramic cylinder within the range 5% to 15% of the diameter in order to maintain an optimum balance between ruggedness of construction and relatively low Q for the transducer response characteristic. With a relatively low Q, the correspondingly wider bandwidth of the transducer response characteristic will insure that when the resonance frequency of the transducer is temporarily lowered by the accumulation of mud or slush over the vibratile surface of the transducer there will not be as great a reduction in sound level output from the transducer which will be operating at a fixed frequency which is temporarily slightly above the reduced mud covered resonance frequency of the transducer. With a thicker wall, the Q of the transducer increases and a correspondingly narrower bandwidth response characteristic would result, in which case the reduction in output level would be relatively greater at the fixed frequency of operation of the transducer when its resonance frequency is temporarily reduced when mud or slush accumulates on its vibratile surface.

FIG. 4 is a schematic drawing illustrating one of many important uses for the described inventive transducer. The sketch illustrates an ultrasonic proximity sensing system for indicating the distances between the left and right rear end surfaces of a truck or trailer and the wall surface of a loading dock against which the rear end of the trailer is approaching as the driver is backing up the vehicle without having a clear view of the position of the vehicle's rear surface as it approaches the dock. The rear of the truck is illustrated by the dotted area 12 in FIG. 4. An ultrasonic transducer 1L incorporating the teachings of this invention is installed at the rear left-hand end of the truck and a similar transducer lR is installed at the rear right-hand end of the truck as shown. Separate electrical connections using conductors 13 and 14 are made from the transducers 1L and 1R to the ranging circuit electronics 15. Electrical output connections 16 and 17 from the ranging circuit electronics are connected as illustrated to the distance indicators 18 and 19 which show the distances in inches between the left and right rear surfaces of the truck and the loading dock.

During operation of the proximity sensing system, the ranging circuit sends an ultrasonic frequency pulse alternately to transducer 1L and 1R and measures the transit times for the pulse echoes to return to each of the left and right-hand transducers after being reflected from the wall surface of the dock. The circuit electronics 15 converts the transit times of the reflected ultrasonic pulses to distances which are then displayed on the indicators 18 and 19 as illustrated in FIG. 4. Circuits for the operation of the ranging electronics are not shown in detail because they are very well known in the art and are not part of this invention. As the operator backs his trailer into position toward a loading dock, which he cannot see clearly, he can read the left and right-hand clearance distances to the dock wall on the indicators 18 and 19 mounted on the dashboard. As the truck is backed into position, the operator first lines up the position of the truck by maneuvering the truck until both range indicators read alike and then he continues backing up until both distance readings approach zero.

In order to obtain better discrimination against ambient background noise, it is desireable that the transducer be designed to have a directional radiation pattern. If the transducers lL and lR in FIG. 4 are mounted with the axes of their cylindrical ceramic elements located in the vertical plane, it will be necessary to make the length of the ceramic cylinders greater than ½ the wavelength of the operating frequency to form a directional beam in the vertical plane. If the length of the cylinder is made approximately equal to one wavelength at the operating frequency, a desireable single vertical beam will be produced with a total angle of approximately 45° at the −3 dB points without any presence of objectionable secondary lobes. The absence of secondary lobes will minimize the possibility of picking up undesireable off-axis secondary targets such as might occur with the presence of secondary lobes of relatively high amplitude in the directional pattern such as would be present if the length of the cylinder were made appreciably greater than one wavelength. The beam angle in the horizontal plane will be determined by the peripheral angle of the outer surface of the ceramic cylinder that is covered with sound insulating material. A satisfactory horizontal beam angle of about 90° will be realized if approximately 240° to 270° of the outer circumference of the cylinder is covered with sound insulation material to prevent radiation of sound as illustrated by the arrangement of the sound insulation 10 in FIG. 3.

This invention has disclosed a novel design of an efficient, rugged, waterproof ultrasonic transducer for generating sound in air. The teachings of this invention have resulted in greatly improved performance characteristics of the transducer even while operating outdoors during harsh environmental weather conditions such as during rain or snow or when mud or slush is splashed over the exposed vibratile surface of the transducer. Although specific examples have been described to illustrate the basic teachings of this invention, it will be obvious to anyone skilled in the art that variations may be made in some of the specific details which have been disclosed without departing materially from the novel teachings of this invention. For example, a polarized ceramic tube has been described as a satisfactory electomechanical transducer material; however, a thin-walled nickel tube with a toroidal winding applied over the nickel wall can also be used as a substitute magnetostrictive electromechanical transducer element if the tube dimensions are chosen to meet specific teachings of this invention as disclosed in this Application. Therefore, I desire that my invention shall not be limited except insofar as is made necessary by the prior art and that the appended claims be construed to cover all equivalent structures.

I claim:

1. An ultrasonic transducer capable of operating out-of-doors during adverse weather conditions including rain, snow or fog, comprising a cylindrical tube of electromechanical transduction material which is capable of vibrating in the circumferential vibratory mode when excited by an electrical oscillating signal, the diameter of said cylindrical tube is selected to resonate within the approximate frequent range 20 kHz to 40 kHz electrical terminal means associated with said cylindrical tube for supplying electrical power to excite said cylindrical tube, a layer of low mechanical impedance sound insulating material applied as a covering to a portion of the outer surface of said cylindrical tube, said covered portion of said outer surface comprising the full length of said tube and at least 180° of the circumferential outer surface of said cylinder, a waterproof encapsulating outer covering completely enclosing said tubular assembly, said encapsulating outer covering characterized in that it makes intimate contact with the uncovered surface area portion of said tubular element, and further characterized in that a portion of said electrical terminal means is positioned to remain external to said waterproof encapsulating outer covering.

2. The invention in claim 1 characterized in that said cylindrical tube of electromechanical transduction material comprises a polarized peizoelectric ceramic with electrodes applied to the inner and outer wall surfaces.

3. The invention in claim 2 further characterized in that the ratio of the wall thickness to the diameter of said polarized ceramic tube is in the approximate range 5% to 15%.

4. The invention in claim 3 further characterized in that the length of said cylindrical tube is greater than ½ wavelength of the frequency at which the fundamental circumferential resonance occurs.

5. The invention in claim 4 further characterized in that the length of said cylindrical tube is less than 1½ times the diameter of said tube.

6. The invention in claim 1 further characterized in that said low mechanical impedance material covers approximately 240° to 270° of the outer periphery of said ceramic tube.

7. The invention in claim 1 characterized in that said encapsulating outer covering is an elastomer.

8. An ultrasonic transducer for operating in the frequency region 20 kHz to 40 kHz comprising a cylindrical tube of polarized ceramic, electrode surfaces applied to the inner and outer wall surfaces of said ceramic tube, electrical terminal means connected to said electrode surfaces, said ceramic tube characterized in that it is capable of vibrating in the circumferential vibratory mode when excited by an electrical oscillating signal applied to said electrical terminal means, said ceramic tube characterized in that the length of the tube is between ½ and 1½ wavelength of the fundamental circumferential resonant frequency of said ceramic tube, said ceramic tube further characterized in that the fundamental circumferential resonant frequency lies within the approximate range 20 kHz to 40 kHz, said ceramic tube further characterized in that the ratio of wall thickness to diameter is in the approximate range 5% to 15%, a layer of low mechanical impedance sound insulating material applied as a covering to a portion of the outer surface of said ceramic cylinder, said covered portion of said outer surface comprising the full length of said tube and approximately 260° of the outer periphery of said tube, a waterproof encapsulating outer covering completely enclosing said ceramic element assembly, said encapsulating outer covering characterized in that it makes intimate contact with the uncovered surface area portion of said tubular ceramic element, and further characterized in that a portion of said electrical terminal means is positioned to remain external to said waterproof encapsulating outer covering.

* * * * *